United States Patent [19]

Ito et al.

[11] Patent Number: 4,581,600

[45] Date of Patent: Apr. 8, 1986

[54] D/A CONVERTER

[75] Inventors: Yuji Ito; Toshinori Murata, both of Yokohama; Masafumi Kazumi, Tokyo, all of Japan

[73] Assignee: Hitachi, Ltd., Tokyo, Japan

[21] Appl. No.: 532,563

[22] Filed: Sep. 15, 1983

[30] Foreign Application Priority Data

Sep. 22, 1982 [JP] Japan ................................ 57-163948

[51] Int. Cl.$^4$ ........................................... H03K 13/02
[52] U.S. Cl. ............................................ 340/347 DA
[58] Field of Search ................... 340/347 DA, 347 M; 328/119

[56] References Cited

U.S. PATENT DOCUMENTS

| | | | |
|---|---|---|---|
| 2,991,422 | 7/1961 | Yaeger | 328/119 |
| 3,217,147 | 11/1965 | Chapman, Jr. | 340/347 M |
| 4,055,773 | 10/1977 | Schoeff | 340/347 DA |
| 4,338,592 | 7/1982 | Wilensky | 340/347 DA |
| 4,450,433 | 5/1984 | Moritama | 340/347 DA |
| 4,503,421 | 3/1985 | Hakeyama et al. | 340/347 DA |

Primary Examiner—Vit W. Miska

Attorney, Agent, or Firm—Antonelli, Terry & Wands

[57] ABSTRACT

A D/A converter comprises one or both of a first D/A converter and a second D/A converter. In the first D/A converter, n (n≧2) semiconductor devices are connected in parallel to each other between a power supply and a load resistor, gates of (n−1) semiconductor devices (called a first group of semiconductor devices) of the n semiconductor devices are connected to a common gate bias potential source, those semiconductor devices of the first group of semiconductor devices which are equal in number to the number determined by a content of high order bits of an input digital data are turned on to supply a current to the load resistor, and a voltage drop across the load resistor is outputted as an analog quantity representing the high order bits. In the second D/A converter, a gate voltage determined by a content of low order bits of the input digital data is supplied to a gate of the remaining one (called a second semiconductor device) of the n semiconductor device to supply a current to the load resistor, and a voltage drop across the load resistor is outputted as an analog quantity representing the low order bits.

4 Claims, 1 Drawing Figure

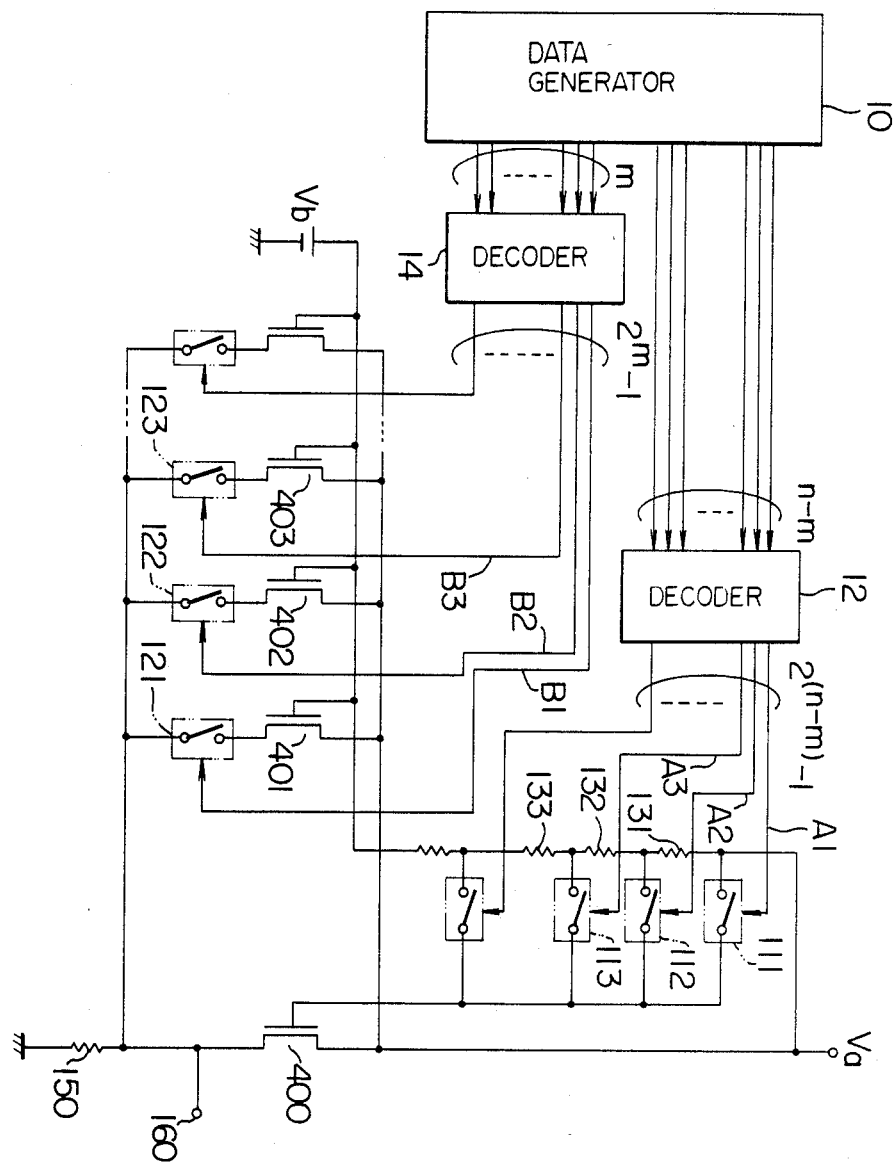

D/A CONVERTER

BACKGROUND OF THE INVENTION

The present invention relates to a digital-to-analog converter (D/A converter) which utilizes semiconductor devices such as MOS transistors, and more particularly to a D/A converter which has a short conversion time and is suitable to implement in the form of an IC structure because high precision resistors are not required, in other words, to a D/A converter suitable for use in a ghost eliminator of a television receiver.

When an electromagnetic wave coming directly from a transmitting antenna (desired wave) and an electromagnetic wave reflected by a building or the like are simultaneously received by a receiving antenna, an image by the desired wave and an image by the reflected wave appear in staggered fashion so that a so-called ghost appears. Such a ghost is a large factor to degrade the image quality in the television receiver and various approaches to eliminate or prevent the ghost have been proposed in the past. One of those approaches is a ghost elimination system using a transversal filter in a video band, as disclosed in U.S. patent application Ser. No. 406,565 filed on Aug. 9, 1982 U.S. Pat. No. 4,476,491 (or EP application No. 82304216.3 filed on Oct. 8, 1982). In the disclosed ghost elimination system, a D/A converter is used to provide DC gain control voltages in accordance with digital data to a number of tapped amplifiers.

A D/A converter which comprises an integrator, a first current source, a second current source having a larger current value than that of the first current source, first connection means for connecting the first current source to the integrator for a period determined by low order bits of digital data, second connection means for connecting the second current source to the integrator for a period determined by high order bits of the digital data, and shorting means for discharging a charge stored in the integrator is disclosed in "Nikkei Electronics, page 200 published on Jan. 18, 1982." In the disclosed D/A converter, a counter is used to count the periods determined by the low order bits and the high order bits. Thus, when the digital data has ten bits which comprise five low order bits and five high order bits, a count period to count 31 clocks at maximum is required. If clock frequency is 5 MHz, the count period of 6.2 μs is required. Further, a certain period is required for operation of the shorting means to discharge the load capacitance prior to the D/A conversion operation. Thus, when 100 or more tapped amplifiers are included in a transversal filter, a period of 1 ms or longer is required before tap gains are distributed to all of the amplifiers. This is a critical problem in the performance of the ghost elimination system.

SUMMARY OF THE INVENTION

It is an object of the present invention to provide a D/A converter which has a short D/A conversion time and hence is suitable for use as a ghost eliminator.

In order to achieve the above object, in accordance with the present invention, there is provided a D/A converter which comprises first current generation means for generating a plurality of magnitudes of currents within a range lower than a predetermined current magnitude, second current generation means for generating currents which are integer multiples of the predetermined current magnitude, first selection means for selecting one of the currents generated by the first current generation means in accordance with the low order bits of digital data such that the current selected increases as the content of the low order bits increases, second selection means for selecting one of the currents generated by the second current generation means in accordance with the remaining high order bits of the digital data such that the current selected increases as the content of the high order bits increases, and summation means for summing the current from the first current generation means selected by the first selection means and the current from the second current generation means selected by the second selection means.

BRIEF DESCRIPTION OF THE DRAWING

A single drawing shows a circuit diagram of one embodiment of the present invention.

DESCRIPTION OF THE PREFERRED EMBODIMENT

In the drawing, numeral 10 denotes a data generator which generates n-bit digital data, numeral 12 denotes a decoder which produces an output voltage on only one of $2^{(n-m)}-1$ output lines in accordance with the value of the low order (n-m) bits of the n-bit data, and numeral 14 denotes a decoder which produces an output voltage on output lines which are equal in number to the decimal equivalent of the content of the high order m bits of the n-bit data. For example, when the low order (n-m) bits are 00 ... 01, the output voltage is produced on an output line A1, where they are 00 ... 10, it is produced on an output line A2, and when they are 00 ... 11, it is produced on an output line A3. When the high order m-bits are 00 ... 01, the output voltage is produced on an output line B1, when they are 00 ... 10, it is produced on the output lines B1 and B2, and when they are 00 ... 11, it is produced on the output lines B1, B2 and B3. Such decoders 12 and 14 can be readily attained by combining AND circuits and OR circuits. Numerals 111, 112, 113, 121, 122 and 123 denote switches which are turned on when the output voltages are applied to their respective control terminals, numerals 131, 132 and 133 denote resistors for dividing a voltage between Va and Vb, numerals 400–403 denote P-MOS transistors which function as current sources, numeral 150 denotes a common resistor for the transistors 400–403 and numeral 160 denotes an output terminal. The number of the resistors 131–133 and the number of the switches 111–113, are equal to $2^{(n-m)}-1$, respectively, and the number of the transistors 401–403 and the number of the switches 121–123 are equal to $2^m-1$, respectively.

The smaller the content of the low order (n-m) bits is, the higher is the gate voltage of the transistor 400 and the smaller is the current of the transistor 400.

The gate sizes of the transistors 400–403 are equal to each other such that the currents of the transistors 400–403 are equal to I. Thus, the current of the transistor 400 which is determined by the low order (n-m) bits is lower than I. Assuming that the digital data consists of five low order bits and five high order bits, the decoders 12 and 14 each has 31 output lines and the decoder 12 selects one of 32 current magnitudes which range between 0, inclusive, and I, not inclusive, in accordance with the low order five bits, and the decoder 14 selects one of 0, I, 2I, 3I, 4I, ... 31I in accordance with the high order five bits. Since the gate bias of the transistor 400 is always higher than the gate biases of the transistors 401–403, the current of the transistor 400 is always lower than the currents I of the transistors 401–403. As a result, a monotonous property is maintained such that the current flowing through the resistor 150 increases as the content of the digital data increases. Since the current is changed in two steps such that it is finely changed by the low order bits and coarsely changed by the high order bits, the conversion time is very short and the circuit scale required is small.

By designing the gate sizes of the transistors 401–403 for the high order bits such that the current magnitudes of the transistors 401–403 are I, $2^1 I$, $2^2 I$ and assigning the bits such that the LSB of the high order bits is assigned to the transistor 401 and the MSB is assigned to the transistor which generates the current $2^{m-1}I$, the decoder 14 can be omitted.

We claim:

1. A D/A converter for producing an analog signal from an n-bit digit signal applied thereto comprising:
   $2^m$ current sources each having a control terminal for producing a current whose value is responsive to a voltage applied to said control terminal, where m<n;
   a first voltage source for producing a first DC voltage;
   a second voltage source for producing a second DC voltage different from said first DC voltage;
   biasing means for supplying said second DC voltage to said control terminals of all but a predetermined one of said current sources;
   m-bit decoder means for effecting operation of a number of said $2^m - 1$ current sources equal to the value of a m-bit digit signal applied thereto;
   voltage dividing means connected between said first and second voltage sources for dividing a voltage between said first and second DC voltages into $2^{n-m} - 1$ different voltages;
   (n-m)-bit decoder means for supplying to said control terminal of said predetermined one of said current sources one of said $2^{n-m} - 1$ voltage whose value is near said second DC voltage in the order of the number of an (n-m)-bit digit signal applied thereto;
   signal providing means for supplying m most significant bits and n-m least significant bits of said n bit digit signal to said m-bit decoder means and said (n-m)-bit decoder means, respectively; and
   summation means for summing a current of all operative current sources including said predetermined one.

2. A D/A converter according to claim 1, wherein said current sources comprise P-MOS transistors.

3. A D/A converter according to claim 1, wherein said voltage divider means comprises a plurality of resistors connected in series between said first and second voltage sources to form respective stages from which respective values of said $2^{n-m} - 1$ different voltages are provided.

4. A D/A converter according to claim 3, wherein said (n-m)-bit decoder means includes a decoder connected to receive said (n-m)-bit digit signal from said signal providing means and having $2^{(n-m)} - 1$ output terminals which are respectively energized according to the value of said (n-m)-bit digit signal, and a plurality of switch devices connecting respective stages of said voltage divider to the control terminal of said predetermined one of said current sources.

* * * * *